United States Patent
Alvord et al.

(10) Patent No.: US 8,928,331 B2
(45) Date of Patent: Jan. 6, 2015

(54) DIAGNOSTIC CIRCUIT AND METHOD OF TESTING A CIRCUIT

(75) Inventors: Robert Alvord, Elmwood Park, IL (US); James Kopec, St. Charles, IL (US); Jochen Aicher, Lisle, IL (US); Vu Nguyen, Carol Stream, IL (US)

(73) Assignee: Diehl AKO Stiftung & Co. KG, Wangen (DE)

(*) Notice: Subject to any disclaimer, the term of this patent is extended or adjusted under 35 U.S.C. 154(b) by 385 days.

(21) Appl. No.: 13/524,556

(22) Filed: Jun. 15, 2012

(65) Prior Publication Data

US 2012/0306509 A1     Dec. 6, 2012

Related U.S. Application Data

(60) Continuation-in-part of application No. 13/166,299, filed on Jun. 22, 2011, now Pat. No. 8,686,737, which is a division of application No. 12/039,209, filed on Feb. 28, 2008, now Pat. No. 8,013,615.

(51) Int. Cl.
*G01R 31/02* (2006.01)
*G01R 31/08* (2006.01)

(52) U.S. Cl.
USPC .......................................... 324/537; 324/522

(58) Field of Classification Search
CPC ............. G01R 31/024; G01R 31/2844; G01R 31/2812
USPC ................................................... 324/537, 522
See application file for complete search history.

(56) References Cited

U.S. PATENT DOCUMENTS

| | | | |
|---|---|---|---|
| 5,900,682 A | 5/1999 | Hung | |
| 7,183,334 B2 | 2/2007 | Guzauskas | |
| 7,183,934 B2 | 2/2007 | Alvord | |

*Primary Examiner* — Amy He
(74) *Attorney, Agent, or Firm* — Laurence A. Greenberg; Werner H. Stemer; Ralph E. Locher

(57) ABSTRACT

A diagnostic circuit for trouble shooting electronic control units of appliances includes a voltage sensing and signal generation device with an input/output and an input. The circuit includes first terminals for connecting to the load and second terminals for connecting to the two lines of the sinusoidal source. One of the first terminals is connected to the input/output, and another one of the first terminals is connected to the input. A relay is connected between one of the second terminals and the input/output. Another relay is connected between another one of the second terminals and the input. A first diode pair with clamping diodes is connected to the input/output, and a second diode pair first diode pair with clamping diodes is connected to the input.

14 Claims, 8 Drawing Sheets

DIAGNOSTIC CIRCUIT AND METHOD OF TESTING A CIRCUIT

CROSS-REFERENCE TO RELATED APPLICATION

This is a continuation-in-part application of application Ser. No. 13/166,299, filed Jun. 22, 2011, which is a divisional application of application Ser. No. 12/039,209, filed Feb. 28, 2008; the prior applications are herewith incorporated by reference in their entirety.

BACKGROUND OF THE INVENTION

1. Field of the Invention

The invention relates to a diagnostic circuit and more specifically to a diagnostic circuit for trouble shooting electronic control units of appliances.

2. Description of the Related Art

Current sensing diagnostic circuits are often used in appliances (e.g. refrigerators) to monitor the operation of electrical components such as, for example, control units of the appliance. During testing, a current should flow when a controlled relay is commanded to close, and a sensor detects that current and reports that the electrical component being tested is operating as intended. If, however, current does not flow through the diagnostic circuit when the relay is commanded to close, the sensor notes the absence of that current and reports to a controller (e.g. microprocessor) that the electrical component is not functioning properly. When the electrical component is not working, malfunctioning, and the like, a technician is often summoned to repair and/or replace the electrical component in the appliance. Unfortunately, an indication of a failure of the electrical component to function properly can occur when a variety of different faults (e.g. an open load, a disconnected wire, and the like) are experienced and/or the electrical component itself is damaged. Therefore, the technician will have to check a number of different potential problems to determine which electrical component has actually failed, which electrical component needs to be replaced, which leads or connections to check, and the like.

Often a current transformer is used in the diagnostic circuit for supplying the current. However, the dynamic range of currents in modern appliances is 10 mA to 25 A. Such a wide range of currents is difficult to produce using a current transformer and requires multiple current transformers leading to a complex diagnostic circuit. In addition, current sensing cannot differentiate between an open load and a defective load.

It is a well-known problem that service technicians have a tendency to automatically replace electronic control units when repairing an appliance. Unfortunately, most of the replaced electronic control units are not defective. There is a need to provide a simple, low cost diagnostic circuit that proves that the control unit is functioning properly and that problems are most likely not related to the electronic control unit.

BRIEF SUMMARY OF THE INVENTION

It is accordingly an object of the invention to provide a diagnostic circuit and a method of testing a circuit that overcomes the above-mentioned disadvantages of the prior art device and methods of this general type, which provides an inexpensive yet effective diagnostic test device for testing control units.

With the foregoing and other objects in view there is provided, in accordance with the invention, a diagnostic circuit for connecting to a unit under test that has a load and a sinusoidal source. The diagnostic circuit includes a voltage sensing device with an input for sensing a signal, a first terminal for connecting to the load, a second terminal for connecting to the sinusoidal source, and a relay connected between the first and second terminals for connecting the sinusoidal source to the load. Clamping diodes are provided and include a first clamping diode connected between a D/C voltage source and the input and a second clamping diode connected between the ground and the input. A resistor is connected between the D/C voltage source and the first terminal.

In accordance with an added feature of the invention, a capacitor is connected between the input and ground for filtering the signals. At least one further resistor is connected between the input and the first terminal for limiting a current sensed at the input.

In accordance with another feature of the invention, the voltage sensing device is a micro-controlled analog-to-digital converter circuit.

With the foregoing and other objects in view there is further provided, in accordance with the invention, a diagnostic circuit for connecting to a unit under test having a load and two lines of a sinusoidal source. The diagnostic circuit includes a voltage sensing device having a first input and a second input, terminals including first terminals for connecting to the load and second terminals for connecting to the two lines of the sinusoidal source, relays each connected between one of the second terminals and one of the first terminals for connecting the sinusoidal source to the load, and a first diode pair having a first clamping diode connected between a D/C voltage source and the first input and a second clamping diode connected between ground and the first input. A second diode pair is provided and has a first clamping diode connected between the D/C voltage source and the second input and a second clamping diode connected between ground and the second input.

In accordance with an additional feature the invention, a first capacitor is connected between the first input and ground, and a second capacitor is connected between the second input and ground. Ideally, at least one first resistor is connected between the first input and a first one of the first terminals for limiting a current sensed at the first input. Furthermore, at least one second resistor is connected between the second input and a second one of the first terminals for limiting a current sensed at the second input. A first pull-down resistor is connected between the first input and ground, and a second pull-down resistor is connected between the second input and ground.

With the foregoing and other objects in view there is further provided, in accordance with the invention, a diagnostic circuit for connecting to a unit under test having a load and a sinusoidal source. The diagnostic circuit includes a voltage sensing device having an input for sensing a signal, terminals including first terminals for connecting to the load and a second terminal for connecting to the sinusoidal source, a relay connected between one of the first terminals and the second terminal for connecting the sinusoidal source to the load, and clamping diodes including a first clamping diode connected between a D/C voltage source and the input and a second clamping diode connected between ground and the input. In this embodiment, a first capacitor is connected between ground and a first one of the first terminals, and a second capacitor is connected between the clamping diodes and a second one of the first terminals.

In accordance with a further feature of the invention, at least one resistor is connected between the input and one of the first and second capacitors.

With the foregoing and other objects in view there is additionally provided, in accordance with the invention, a diagnostic circuit for connecting to a unit under test having a load and a sinusoidal source. The diagnostic circuit contains a voltage sensing device having a first input for sensing a signal and a second input, terminals including a first terminal for connecting to the load and a second terminal for connecting to the sinusoidal source, a relay connected between the first terminal and the second terminal for connecting the sinusoidal source to the load, and clamping diodes including a first clamping diode connected between a D/C voltage source and the input and a second clamping diode connected between ground and the input. A first capacitor is connected between the first terminal and the first input and a second capacitor connected between the second terminal and the second input.

In accordance with another added feature of the invention, at least one resistor is connected between the first input and the first capacitor.

With the foregoing and other objects in view there is additionally provided, in accordance with the invention, a diagnostic circuit for connecting to a unit under test having a load and three lines of a sinusoidal source. The diagnostic circuit contains a voltage sensing device having a first input and a second input, terminals including first terminals for connecting to the load and second terminals for connecting to two lines of the sinusoidal source, relays each connected between one of the second terminals and one of the first terminals for connecting the sinusoidal source to the load, a first diode pair having a first clamping diode connected between a D/C voltage source and the first input and a second clamping diode connected between ground and the first input, and a second diode pair having a first clamping diode connected between the D/C voltage source and the second input and a second clamping diode connected between ground and the second input. A first capacitor is connected between a first of the first terminals and the first input; and a second capacitor is connected between a second of the first terminals and the second input.

In accordance with a further feature of the invention, a third capacitor is connected between a third line of the sinusoidal source and the ground.

In accordance with another feature of the invention, at least one resistor is connected between the first input and the first capacitor. Preferably, at least one resistor is connected between the second input and the second capacitor.

With the foregoing and other objects in view there is additionally provided, in accordance with the invention, a method for testing a circuit. The method includes the steps of connecting a diagnostic test circuit to a load terminal of the circuit and to a line of a sinusoidal source of the circuit; maintaining a relay connected between the load terminal and the line in an open position; sensing a first voltage signal at a sensing node coupled to the load terminal; deriving an operational condition of the circuit in dependence on the first voltage signal sensed.

In accordance with an added mode of the invention, there are the further steps of switching the relay to a closed position for connecting the load to the sinusoidal source; sensing a second voltage signal at the sensing node; and deriving the operational condition of the circuit in dependence on the second voltage signal sensed. The circuit is considered to be error free if the first voltage signal is less than 4 V D/C and that the second voltage signal is an oscillating signal. The circuit is considered to be defective if the first voltage signal is greater than 4.5 V D/C or no oscillating signal is detected.

With the foregoing and other objects in view there is provided, in accordance with the invention, a method for testing a circuit. The method includes the steps of connecting a diagnostic tester to a load terminal of the circuit and to two lines of a multi-phase sinusoidal source of the circuit; maintaining a first relay, of the diagnostic tester, connected between a first load terminal and a first line in an open position; maintaining a second relay, of the diagnostic tester, connected between a second load terminal and a second line in an open position; sensing a first voltage signal at a first sensing node coupled to the first load terminal; sensing a second voltage signal at a second sensing node coupled to the second load terminal; and deriving an operational condition of the circuit in dependence on the first and second voltage signals sensed.

In accordance with an added mode of the invention, there are the further steps of switching the first relay to a closed position for connecting the load to a first line of the multiphase sinusoidal source; sensing a third voltage signal at the first sensing node; sensing a fourth voltage signal at the second sensing node; and deriving the operational condition of the circuit in dependence on the third and fourth voltage signals sensed.

In accordance with a further mode of the invention, there are the further steps of switching the first relay to an opened position; switching the second relay to a closed position for connecting the load to a second line of the multiphase sinusoidal source; sensing a fifth voltage signal at the first sensing node; sensing a sixth voltage signal at the second sensing node; and deriving the operational condition of the circuit in dependence on the fifth and sixth voltage signals sensed.

In accordance with another added mode of the invention, there are the further steps of switching the first relay to a closed position; maintaining the second relay at the closed position; sensing a seventh voltage signal at the first sensing node; sensing an eighth voltage signal at the second sensing node; and deriving the operational condition of the circuit in dependence on the seventh and eighth voltage signals sensed.

The circuit is considered error free if the first and second voltage signals are logic low. The circuit is considered error free if the third and fourth voltage signals are oscillating signals having the same phase. The circuit is considered error free if the fifth and sixth voltage signals are oscillating signals having the same phase. The circuit is considered error free if the seventh and eighth voltage signals are oscillating signals having different phases.

With the foregoing and other objects in view there is provided, in accordance with the invention, a diagnostic circuit for connecting to a unit under test having a load and two lines of a sinusoidal source. The diagnostic circuit includes a voltage sensing and signal generation device having an input/output and an input. The diagnostic circuit includes a plurality of terminals including first terminals for connecting to the load and second terminals for connecting to the two lines of the sinusoidal source. One of the first terminals is connected to the input/output, and another one of the first terminals is connected to the input. The diagnostic circuit includes a plurality of relays. One of the plurality of relays is connected between one of the second terminals and the input/output. Another one of the plurality of relays is connected between another one of the second terminals and the input. The diagnostic circuit includes a D/C voltage source and ground. The diagnostic circuit includes a first diode pair having a first clamping diode connected between the D/C voltage source and the input/output and a second clamping diode connected between the ground and the input/output. The diagnostic circuit also includes a second diode pair having a first clamping diode connected between the D/C voltage source and the input and a second clamping diode connected between the ground and the input.

In accordance with another feature of the invention, a first capacitor is connected between the input/output and the ground; and a second capacitor is connected between the input and the ground.

In accordance with another added feature of the invention, at least one first resistor is connected between the input/output and a first one of the first terminals for limiting a current sensed at the input/output; and at least one second resistor is connected between the input and a second one of the first terminals for limiting a current sensed at the input.

In accordance with another feature of the invention, a first pull-down resistor is connected between the input/output and the ground; and a second pull-down resistor is connected between the input and the ground.

In accordance with another added feature of the invention, a first isolation capacitor is connected between the input/output and a first one of the first terminals; a second isolation capacitor is connected between the input and a second one of the first terminals; and a third isolation capacitor is provided for connection between neutral and DC ground.

In accordance with another feature of the invention, the voltage sensing and signal generation device has a first operating mode in which the input/output of the voltage sensing and signal generation device is an output, and a second operating mode in which the input/output of the voltage sensing and signal generation device is an input.

In accordance with another added feature of the invention, the circuit has an additional terminal for connecting to an additional load, and the voltage sensing and signal generation device has a further input connected to the additional terminal; the circuit has a further terminal for connecting to one of the two lines of the sinusoidal source; the circuit has a further relay connected between the further terminal and the further input; and the circuit has a third diode pair having a first clamping diode connected between the D/C voltage source and the further input and a second clamping diode connected between the ground and the further input.

In accordance with another feature of the invention, a pull-down resistor is connected between the further input and the ground; a capacitor is connected between the further input and the ground; at least one resistor is connected between the further input and the additional terminal; and an isolation capacitor is connected between the further input and the additional terminal.

With the foregoing and other objects in view there is provided, in accordance with the invention, a diagnostic circuit for connecting to a unit under test having a load and a sinusoidal source. The diagnostic circuit includes a voltage sensing and signal generation device having an input for sensing a signal and an output for providing a signal. The diagnostic circuit includes a first terminal for connecting to the load and a second terminal for connecting to the sinusoidal source. The diagnostic circuit includes a relay connected between the second terminal and the input. The diagnostic circuit includes a D/C voltage source and ground. The diagnostic circuit includes a first diode pair having a first clamping diode connected between the D/C voltage source and the input and a second clamping diode connected between the ground and the input. The diagnostic circuit includes a second diode pair having a first clamping diode connected between the D/C voltage source and the input/output and a second clamping diode connected between the ground and the input/output.

In accordance with another feature of the invention, a pull-down resistor is connected between the input and the ground; a capacitor is connected between the input and the ground; at least one resistor is connected between the input and the first terminal; an isolation capacitor is connected between the input and the first terminal; an isolation capacitor is connected between the output and the first terminal; and an isolation capacitor is provided for connection between neutral and DC ground.

With the foregoing and other objects in view there is provided, in accordance with the invention, a diagnostic circuit for connecting to a unit under test having a load and a sinusoidal source. The diagnostic circuit includes a voltage sensing and signal generation device having a first input, a second input, and an output. The diagnostic circuit includes a plurality of first terminals. Each one of the plurality of first terminals is for connecting to a respective one of a plurality of loads. The diagnostic circuit includes a plurality of second terminals for connecting to the sinusoidal source. The diagnostic circuit includes a plurality of relays each connected between a respective one of the plurality of second terminals and a respective one of the plurality of first terminals. The diagnostic circuit includes a D/C voltage source and ground. The diagnostic circuit includes a first diode pair having a first clamping diode connected between the D/C voltage source and the first input and a second clamping diode connected between the ground and the first input. The diagnostic circuit includes a second diode pair having a first clamping diode connected between the D/C voltage source and the second input and a second clamping diode connected between the ground and the second input. The diagnostic circuit includes a third diode pair having a first clamping diode connected between the D/C voltage source and the output and a second clamping diode connected between the ground and the output.

In accordance with another feature of the invention, a first resistor is connected between the output and the third diode pair; a second resistor is connected to the output; and there is provided a fourth diode pair having a first clamping diode connected between the D/C voltage source and the second resistor and a second clamping diode connected between the ground and the second resistor.

In accordance with another added feature of the invention, at least one resistor and an isolation capacitor are connected in series between the first input and a first one of the plurality of first terminals; at least one resistor and an isolation capacitor are connected in series between the second input and a second one of the plurality of first terminals; at least one resistor and an isolation capacitor are connected in series between the output and the first one of the plurality of first terminals; at least one resistor and an isolation capacitor are connected in series between the output and the first one of the plurality of first terminals; and an isolation capacitor is provided for connection between neutral and DC ground.

In accordance with another feature of the invention, at least one resistor and an isolation capacitor are connected in series between the first input and a first one of the plurality of first terminals; at least one resistor and an isolation capacitor are connected in series between the second input and a second one of the plurality of first terminals; an amplifier having an input is connected to the output, the amplifier having an output; at least one resistor and an isolation capacitor are connected in series between the output of the amplifier and the first one of the plurality of first terminals; at least one resistor and an isolation capacitor are connected in series between the output of the amplifier and the first one of the plurality of first terminals; and an isolation capacitor is provided for connection between neutral and DC ground.

Other features which are considered as characteristic for the invention are set forth in the appended claims.

Although the invention is illustrated and described herein as embodied in a diagnostic circuit and a method of testing a circuit, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS OF THE INVENTION

Figure 1:
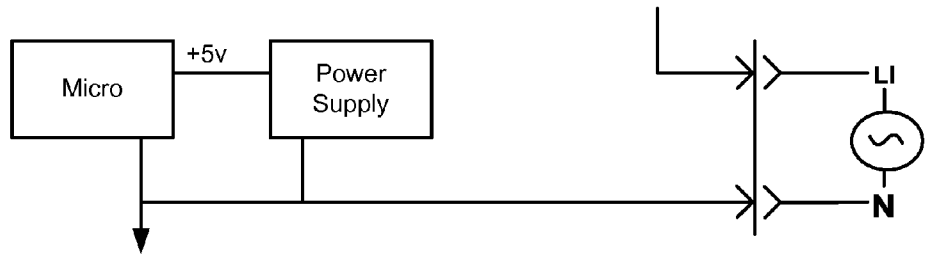
FIG. 1 is a block diagram of a basic circuit.
Figure 2:
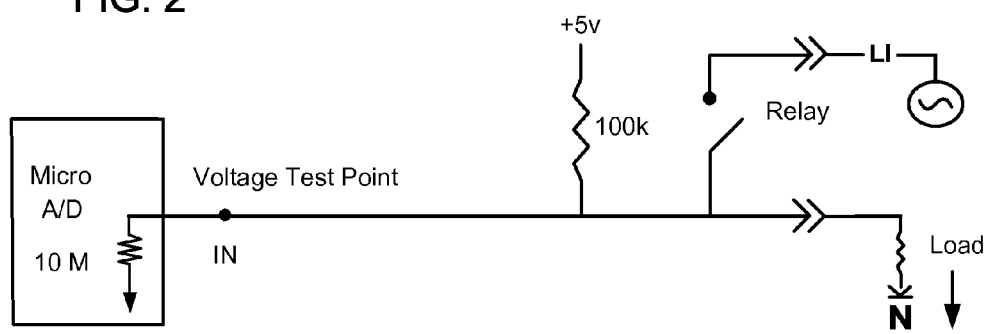
FIG. 2 is a schematic diagram for explaining basic testing techniques.

Referring now to the figures of the drawing in detail and first, particularly, to FIG. 1 thereof, there is shown a basic circuit which shows a connection from logic ground of a micro-controlled A/D device MICRO to neutral N of a mains power supply. An operational equivalent schematic circuit with the addition of a relay RELAY is shown in FIG. 2 for testing a proper connection to a load LOAD with the return to neutral N traversing through the D/C circuit ground. With the relay RELAY open a simple voltage divider network is formed with the voltage being read at an input IN of the A/D device being a voltage sensing device. Table I shows the expected voltage readings in dependence on the ohmic resistance of the load.

TABLE I

| Load | Voltage at Input IN |
|---|---|
| 1k ohm | 0.05 volts |
| 10k ohm | 0.45 volts |
| 100k ohm | 2.5 volts |
| Open | 5 volts |

Based on the voltages observed one can make conclusions about the operational functionality of the load such as a control device of an appliance.

Figure 3:
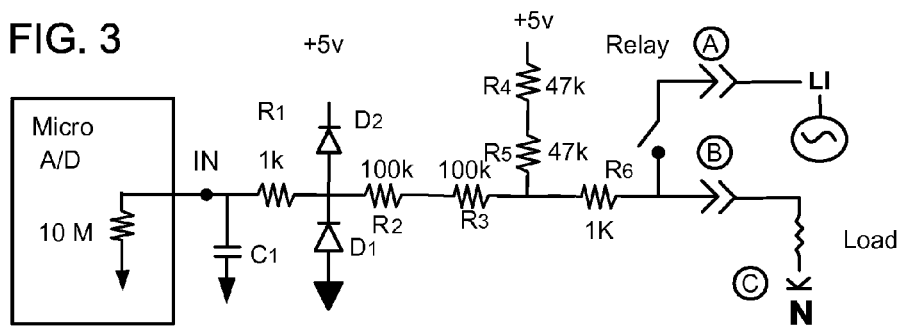
FIG. 3 is a schematic diagram of a first embodiment of a diagnostic circuit according to the invention.

FIG. 3 shows a first embodiment of a diagnostic circuit according to the invention following the basic concepts taught in FIGS. 1 and 2 that is ideally suited for lower current loads typically energized by 120 V A/C. In FIG. 3, a filter capacitor C1 is provided for filtering noise. Clamping diodes D1 and D2 are provided for clamping A/C voltages and turning A/C sinusoidal signals into a square wave clamped between 0 and 5 volts. Voltage and current limiting resistors R1, R2, R3 protect the circuit from high currents. Resistors R4 and R5 are provided for current limiting and redundancy. Resistor R6 is also provided for current limiting. The load LOAD represents a control unit of an appliance or the unit under test. Three connection points A, B and C are shown, two connection points A and B are for connecting the diagnostic circuit to the appliance, specifically an A/C source line L1 and the load LOAD. An internal connection C is the connection to A/C neutral N. The diagnostic circuit measures all readings at the input IN for determining test results. The following table now defines the operation of the diagnostic test circuit when it is hooked up for eight different diagnostic results. In Table II it is assumed that the load LOAD is less than 300 K ohms. Of course it goes without saying that the value of the resistors shown in FIG. 3 is dependent of the value of the load LOAD.

TABLE II

| Point A | Point B | Point C | Relay | Reading at IN | Comment |
|---|---|---|---|---|---|
| 1. Connected | Connected | Connected | Open | $V_{A/D} < 4\,V$ | No errors detected |
| 2. Connected | Connected | Connected | Closed | 60 Hz square wave (in phase with L1) | No errors detected |
| 3. Connected | Connected | Connected | Error - Stuck closed (s/b open) | 60 Hz square wave (in phase with L1) | Error detected in relay operation. |
| 4. Disconnected | Connected | Connected | Open | $V_{A/D} < 4.0\,V$ | Error in line undetected |
| 5. Disconnected | Connected | Connected | Closed | $V_{A/D} > 4.5\,V$ | Error detected at relay or line L1 dependant on configuration. |
| 6. Connected | Disconnected | Connected | Open | $V_{A/D} > 4.5\,V$ | Error detected, no load or wiring open. |
| 7. Connected | Connected | Disconnected | Open | $V_{A/D} > 4.5\,V$ | Error detected, no load or wiring open |

TABLE II-continued

| Point A | Point B | Point C | Relay | Reading at IN | Comment |
|---|---|---|---|---|---|
| 8. Connected | Connected | Disconnected | Closed | 60 Hz square wave (in phase with L1) | Error not detected |

Rows 1 and 2 show conditions in which everything is working properly and no errors are detected. Row 3 shows the condition in which the relay RELAY of the diagnostic test circuit is detected as faulty (e.g. stuck closed). Row 4 shows the condition where the line L1 is faulty (open) but it is not diagnosed until the conditions in row 5 are performed. In row 5 a 60 Hz square wave was anticipated but a D/C voltage level is detected. Row 6 shows the conditions from determining a load failure or an internal connection to neutral N failure because a 60 Hz square wave was expected but only a D/C voltage reading was measured. In row 7 the error is not detected.

For controlling more than one load, the circuit in FIG. 3 can be repeated for each additional load.

Figure 4:
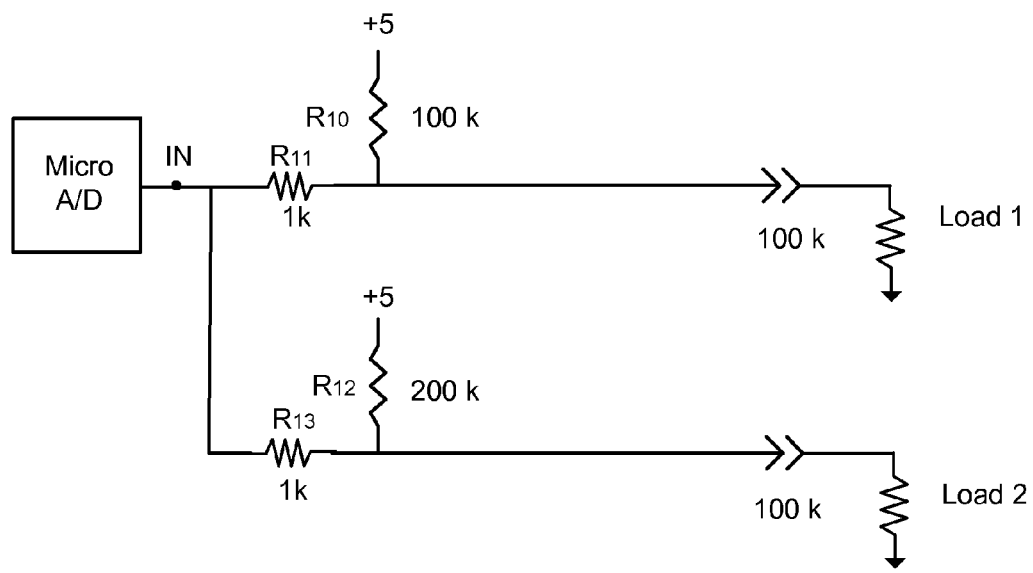
FIG. 4 is a schematic diagram of a second embodiment of the diagnostic circuit according to the invention.

FIG. 4 shows a second embodiment of the diagnostic circuit in which loads LOAD 1 and LOAD 2 can be multiplexed and in which only one micro-controlled A/D device MICRO is needed. In addition, for simplicity FIG. 4 omits protective devices such as current and/or voltage limiting resistors and capacitive filters. In FIG. 4, two pull-up resistors R10, R12 are connected between a respective load LOAD 1, LOAD 2 and a 5 volts source. Between each load LOAD 1, LOAD 2 and the one micro-controlled A/D device MICRO is a resistor R11, R13, respectively. Table III shows the expected voltage results to be seen at the input IN.

TABLE III

| Load Connection | Voltage Seen at IN |
|---|---|
| Load 1 connected Load 2 connected | 2.1 volts |
| Load 1 Open Load 2 Connected | 2.5 volts |
| Load 1 Connected Load 2 Open | 1.67 volts |
| Load 1 Open Load 2 Open | 5 volts |

From Table III it is easy to ascertain voltage ranges to determine pass and fail criteria for the loads. For example, a voltage greater than 4.5 volts indicates that both loads failed, a voltage in the range of 1.9 to 2.3 volts indicates that both loads passed, a voltage below 1.9 volts indicates that LOAD 2 failed, and a voltage in the range of 2.3 to 3.0 volts indicates that LOAD 1 failed. Of course the ranges are load dependent.

Figure 5:
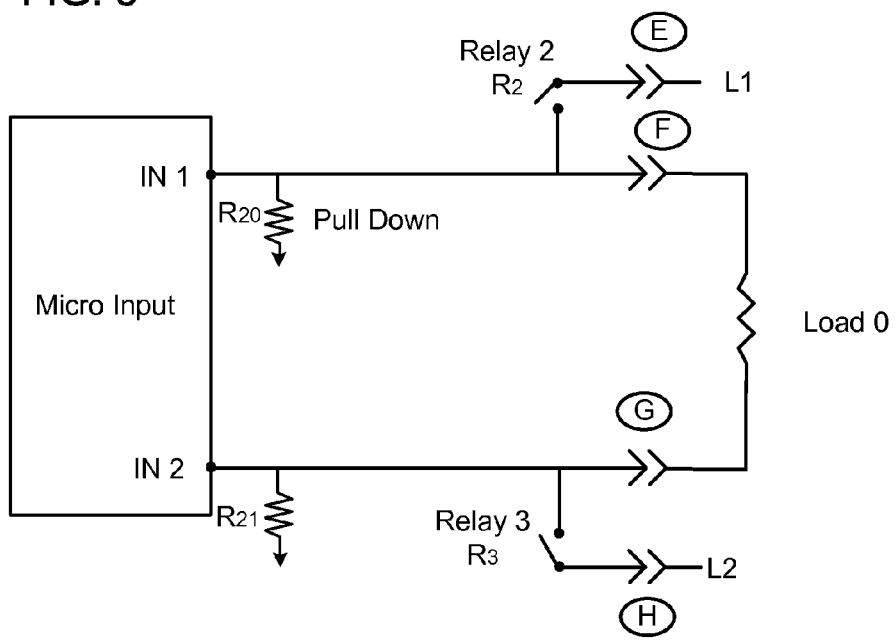
FIGS. 5-8 are schematic diagrams of a third embodiment of the diagnostic circuit according to the invention.

FIG. 5 shows a third embodiment of a simplified diagnostic circuit suited for higher current loads typically energized by 240 V A/C such as heater loads. The test circuit of FIG. 5 is ideally suited for sensing high current, lower ohm loads connected to a 240 V A/C source. In FIG. 5, the diagnostic circuit has connection points E, F, G and H for connecting to the load LOAD and to the A/C lines L1 and L2 of the appliance under test. Two relays RELAY 2 and RELAY 3 connect the A/C lines L1 and L2 to the load LOAD. Two pull down resistors R20 and R21 connect the load to ground. As in FIG. 1, the power connections are configured such that D/C ground equals or is connected to A/C neutral N (e.g. a common ground). The micro-controlled A/D device in this instance has two inputs IN1 and IN2. The pull down resistors R20 and R21 connected to the inputs IN1 and IN2 ensure a low reading with no connections. It is further noted that a digital input can be used in place of the A/D inputs. In FIG. 5 it is assumed that the load LOAD is between 15-20 ohms meaning that the current is in the 10-16 amp range for 240 V A/C.

Figure 6:
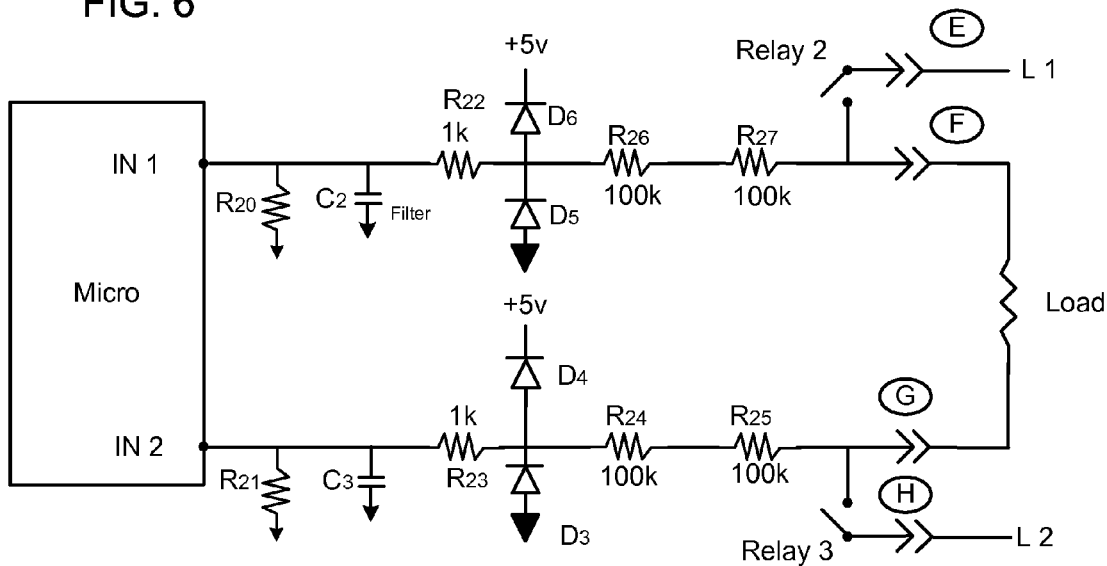

The diagnostic circuit shown in FIG. 6 is based on FIG. 5 but has incorporated protection circuitry, filtering circuitry and clamping circuitry. More specifically filtering capacitors C2 and C3, current limiting resistors R22-R27 and clamping diodes D3-D6 have been added and are functionally similarly to the same components shown in FIG. 3.

Figure 7:
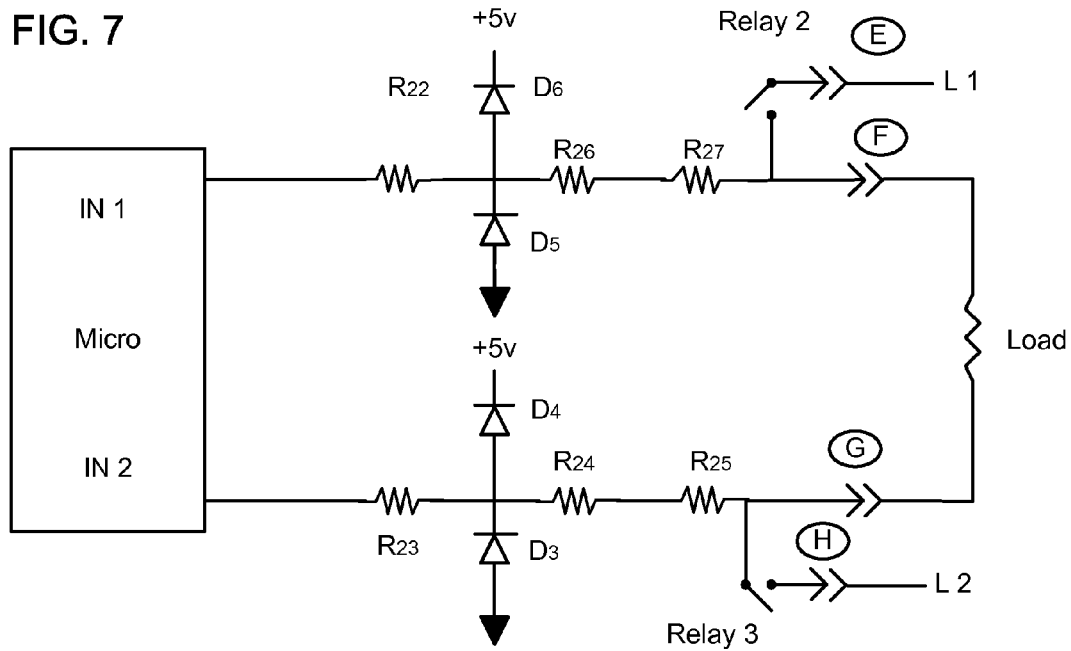
Figure 8:
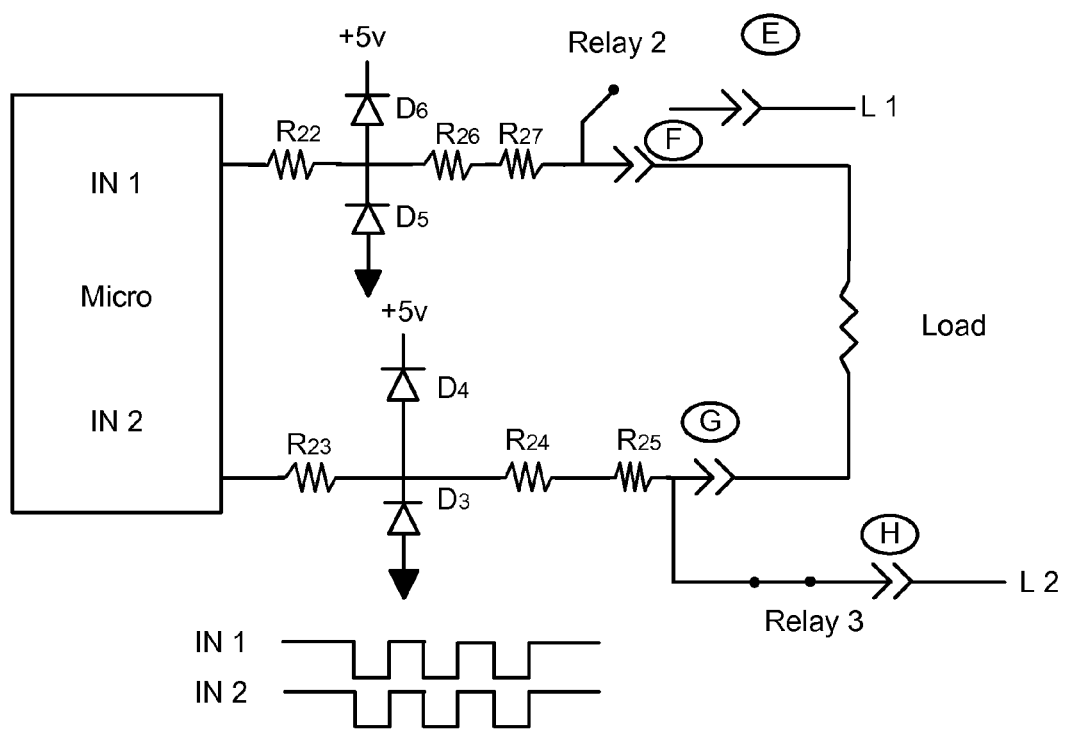

FIGS. 7 and 8 are simplified versions of FIG. 6 with only the clamping and currently limiting circuitry shown for clarity. As shown in FIG. 7, the A/C signal is provided by the line L1 to the relay RELAY 2 and conducted to the inputs IN1 and IN2 in which the sinusoidal signal is clamped by the diode pairs D5, D6 and D3, D4 respectively resulting in the shown square wave of 0 to 5 V (see FIG. 8).

FIG. 8 shows the same sinusoidal signal conducted by line L2 into relay RELAY 3 to the inputs IN1 and IN2. The sinusoidal signal on line L2 being 180° out of phase compared to the sinusoidal signal on line L1 for a two-phase sinusoidal source.

Table IV shows the operating states and expected results for the circuit shown in FIG. 6.

TABLE IV

| L1 input | L2 input | Load | Relay R2 | Relay R3 | IN 1 Digital input signal (load signal) | IN 2 Digital input signal (DLB signal) | Comment |
|---|---|---|---|---|---|---|---|
| Group A | | | | | | | |
| Connected | Connected | Connected | open | open | Logic low | Logic low | Good control and wiring |

TABLE IV-continued

| L1 input | L2 input | Load | Relay R2 | Relay R3 | IN 1 Digital input signal (load signal) | IN 2 Digital input signal (DLB signal) | Comment |
|---|---|---|---|---|---|---|---|
| Connected | Connected | Connected | open | closed | 60 Hz square wave (in phase with L2) | 60 Hz square wave (in phase with L2) | Good control and wiring |
| Connected | Connected | Connected | closed | open | 60 Hz square wave (in phase with L1) | 60 Hz square wave (in phase with L1) | Good control and wiring |
| Connected | Connected | Connected | closed | closed | 60 Hz square wave (in phase with L1) | 60 Hz square wave (in phase with L2) | Good control and wiring |
| Group B | | | | | | | |
| Disconnected | Connected | Connected | open | Open | Logic low | Logic low | |
| Disconnected | Connected | Connected | open | closed | 60 Hz square wave (in phase with L2) | 60 Hz square wave (in phase with L2) | |
| Disconnected | Connected | Connected | closed | Open | Logic low | Logic low | Error detected L1 disconnect |
| Disconnected | Connected | Connected | closed | closed | 60 Hz square wave (in phase with L2) | 60 Hz square wave (in phase with L2) | Error detected L1 disconnect |
| Group C | | | | | | | |
| Connected | Disconnected | Connected | open | open | Logic low | Logic low | |
| Connected | Disconnected | Connected | open | closed | Logic low | Logic low | Error detected L2 disconnect |
| Connected | Disconnected | Connected | closed | open | 60 Hz square wave (in phase with L1) | 60 Hz square wave (in phase with L1) | |
| Connected | Disconnected | Connected | closed | closed | 60 Hz square wave (in phase with L1) | 60 Hz square wave (in phase with L1) | Error detected L2 disconnect |
| Group D | | | | | | | |
| Connected | Connected | Disconnected | open | open | Logic low | Logic low | |

TABLE IV-continued

| L1 input | L2 input | Load | Relay R2 | Relay R3 | IN 1 Digital input signal (load signal) | IN 2 Digital input signal (DLB signal) | Comment |
|---|---|---|---|---|---|---|---|
| Connected | Connected | Disconnected | open | closed | Logic low | 60 Hz square wave (in phase with L2) | Error detected load disconnect |
| Connected | Connected | Disconnected | closed | open | 60 Hz square wave (in phase with L1) | Logic low | Error detected load disconnect |
| Connected | Connected | Disconnected | closed | closed | 60 Hz square wave (in phase with L1) | 60 Hz square wave (in phase with L2) | |
| Group E | | | | | | | |
| Connected | Connected | Connected | Closed s/b open | Open | 60 Hz square wave (in phase with L1) | 60 Hz square wave (in phase with L1) | Relay/control error detected |
| Connected | Connected | Connected | Open | Closed s/b open | 60 Hz square wave (in phase with L2) | 60 Hz square wave (in phase with L2) | Relay/control error detected |

Group A shows the four conditions of a properly functioning load and wiring with no errors detected.

Group B shows the error detected when line L1 is disconnected. However, we are not sure whether it is a line L1 connection error or a relay RELAY 2 error. It is generally assumed that it is the line L1 connection as the diagnostic circuit is periodically checked.

Group C shows the error detected when line L2 is disconnected. As stated above, we are not sure whether it is the line L2 connection error or a relay RELAY 3 error. It is assumed to be a line L2 error.

Group D shows the error when the load LOAD is not properly connected.

Group E shows the case when relay RELAY 2 is stuck closed when it should be open.

Group F shows the case when relay RELAY 3 is stuck closed when it should be open.

Figure 9:
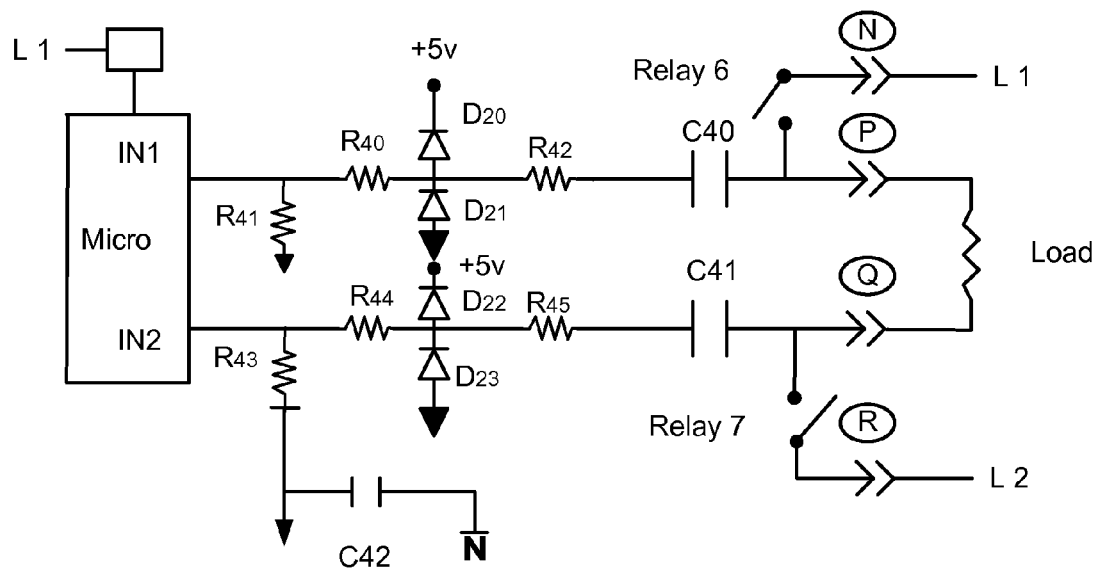
FIG. 9 is a schematic diagram of a fourth embodiment of the diagnostic circuit according to the invention.

FIG. 9 illustrates a fourth embodiment of the diagnostic circuit. FIG. 9 shows a capacitively isolated diagnostic test circuit for a three phase, 240 V A/C signal. Terminals N, P, Q and R supply connection points to the unit under test for connecting lines L1, L2 to relays RELAY 6 and RELAY 7 respectively and to the load LOAD. Isolation capacitors C40, C41, and C42 isolate the lines L1, L2 and neutral N from the rest of the circuit. Current protection resistors R40-R45 are provided as are the clamping diode sets D20, D21 and D22, D23 for protecting the micro-controlled A/D device MICRO from harmful high-level currents and voltages. FIG. 9 further shows a reference clock driven by line L1.

Table V shows the expected results for a properly operating load and relay and further identifies various errors.

TABLE V

| L1 input | L2 input | Load | Relays 6-7 | Result at IN 1 | Result at IN 2 |
|---|---|---|---|---|---|
| Connected | Connected | Connected | Both open | Logic low | Logic low |
| 2. Connected | Connected | Connected | L1 relay 6 closed | 60 Hz square wave (in phase with L1) | 60 Hz square wave (in phase with L1) |
| 3. Connected | Connected | Connected | L2 relay 7 closed | 60 Hz square wave (in phase with L2) | 60 Hz square wave (in phase with L2) |
| 4. Connected | Connected | Connected | Both relays closed | 60 Hz square wave (in phase with L1) | 60 Hz square wave (in phase with L2) |

TABLE V-continued

| L1 input | L2 input | Load | Relays 6-7 | Result at IN 1 | Result at IN 2 |
|---|---|---|---|---|---|
| 5. Disconnected | Connected | Connected | Both open | Logic low | Logic low |
| 6. Disconnected | Connected | Connected | L1 relay 6 closed | Logic low Error detected | Logic low Error detected |
| 7. Connected | Disconnected | Connected | Both open | Logic low | Logic low |
| 8. Connected | Disconnected | Connected | L2 relay 7 closed | Logic low Error detected | Logic low Error detected |
| 9. Connected | Connected | Disconnected | Both open | Logic low | Logic low |
| 10. Connected | Connected | Disconnected | L1 relay 6 closed | 60 Hz square wave (in phase with L1) | Logic low Error detected |
| 11. Connected | Connected | Disconnected | L2 relay 7 closed | Logic low Error detected | 60 Hz square wave (in phase with L2) |

Rows 1-4 show the various connection configurations for a properly operating load and relays and the expected results at the inputs IN 1 and IN 2. Row 5 is the case where the line L1 is disconnected but this error is not detected until the configuration of row 6 is set up and a square wave is expected but only a logic low signal is detected. Row 7 is the case where the line L2 is disconnected but this error is not detected until the circuit configuration of row 8 is set up and a square wave is expected but only a logic low signal is detected. Row 9 is the case where the load LOAD is disconnected but the disconnection is not diagnosed until the circuit conditions of either row 10 or 11 are performed and logic low conditions are detected at one of the inputs.

Figure 10:
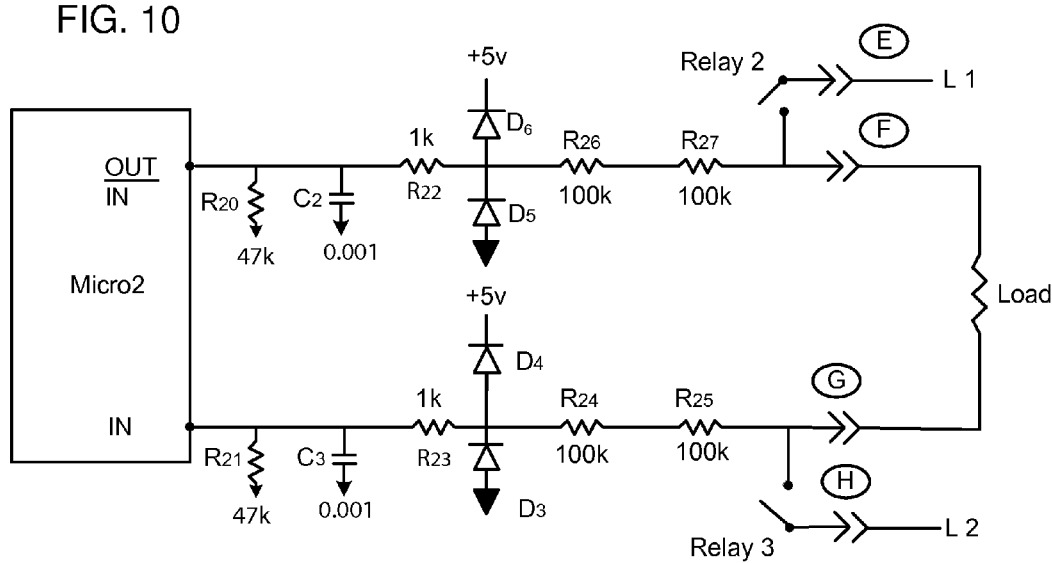
FIGS. 10-15 are schematic diagrams showing additional embodiments of the diagnostic circuit according to the invention.

FIG. 10 shows an embodiment of a diagnostic circuit for testing a non-isolated 220/230 V load. The diagnostic circuit shown in FIG. 10 is based on that shown in FIG. 6. Since basically the same components are present, most of the reference characters used to identify the components in FIG. 10 are the same as in FIG. 6. However, the circuit in FIG. 10 differs from the circuit in FIG. 6 in that the circuit in FIG. 10 has a voltage sensing and signal generation device MICRO2 which includes both a micro-controlled A/D device and a signal generation device for generating a signal. The voltage sensing and signal generation device MICRO2 includes an input IN for receiving an input signal applied thereto and for providing that input signal to the micro-controlled A/D device of the voltage sensing and signal generation device MICRO2. The voltage sensing and signal generation device MICRO2 also includes an input/output IN/OUT that can be configured as an output when desired and that can also be configured as an input at other desired times.

The voltage sensing and signal generation device MICRO2 has an operating mode in which the input/output IN/OUT is configured to function as an output and the output signal generated by the signal generation device of the voltage sensing and signal generation device MICRO2 is output at the input/output IN/OUT. In the operating mode in which the input/output IN/OUT is configured to function as an output, a signal, preferably, a pulse train of a predetermined frequency is generated by the signal generation device of the voltage sensing and signal generation device MICRO2 and is output at the input/output IN/OUT of the voltage sensing and signal generation device MICRO2.

The voltage sensing and signal generation device MICRO2 also has an operating mode in which the input/output IN/OUT is configured to function as an input and an input signal applied to the input/output IN/OUT is input into the micro-controlled A/D device of the voltage sensing and signal generation device MICRO2.

The input/output IN/OUT could be implemented using a single pin or contact that extends externally from the voltage sensing and signal generation device MICRO2. However, it may also be possible to provide one pin or external contact that serves as the input and to provide another pin or external contact that serves as the output. These two pins or contacts could then be connected together at a node external to the voltage sensing and signal generation device MICRO2.

The diagnostic circuit has terminals or connection points F and G for connecting to the load LOAD and has terminals or connection points E and H for connecting to the A/C lines L1 and L2 of the appliance under test.

To sense whether the load LOAD is connected, instead of turning on Relay 2 and Relay 3 (as would be done in some of the previously described embodiments), Relay 2 and Relay 3 are left open, and the voltage sensing and signal generation device MICRO2 is set to the operating mode in which a signal, preferably, a pulse train of a predetermined frequency is output at the input/output IN/OUT of the voltage sensing and signal generation device MICRO2. The predetermined frequency of the pulse train that is output at the input/output IN/OUT is relatively high compared to the frequency (typically 60 HZ in the US or 50 HZ in Europe) of the AC line voltage available at lines L1 and L2. For example, the predetermined frequency of the pulse train that is output at the input/output IN/OUT can be set to 10 kHZ. As another example, the predetermined frequency of the pulse train that is output at the input/output IN/OUT can be set to 1 kHZ. A load LOAD with an impedance of, for example, 10 or 20 ohms will allow a pulse train of 1 kHZ to pass therethrough without causing any significant heating. The signal that is input at the separate input IN shown at the lower side of the voltage sensing and signal generation device MICRO2 enables the micro-controlled A/D device MICRO of the voltage sensing and signal generation device MICRO2 to detect the load LOAD by either sensing the pulse train output by the input/output IN/OUT or by sensing a change of the voltage across the capacitor C3 of about 0.5 Vcc. The chosen values of R21 and C3 will depend on the frequency of the output pulse train and on the method of detecting the load LOAD. After the load LOAD is detected, the operating mode of the voltage sensing and signal generation device MICRO2 is changed such that the input/output IN/OUT is turned back to an input and the AC line voltage input at lines L1 and L2 is sensed as has been explained with reference to the circuit shown in FIG. 6 and Table IV.

For example, when the predetermined frequency of the pulse train that is output at the input/output IN/OUT is 10 kHZ, example component values could be as follows: $R_{20}=R_{21}=47$ k ohms, $R_{22}=R_{23}=1$ k ohms, $R_{24}=R_{25}=R_{26}=R_{27}=100$ k ohms, and $C_2=C_3=0.001$ µF. Of course, it should be understood that many other different combinations of component values could be used.

Figure 11:
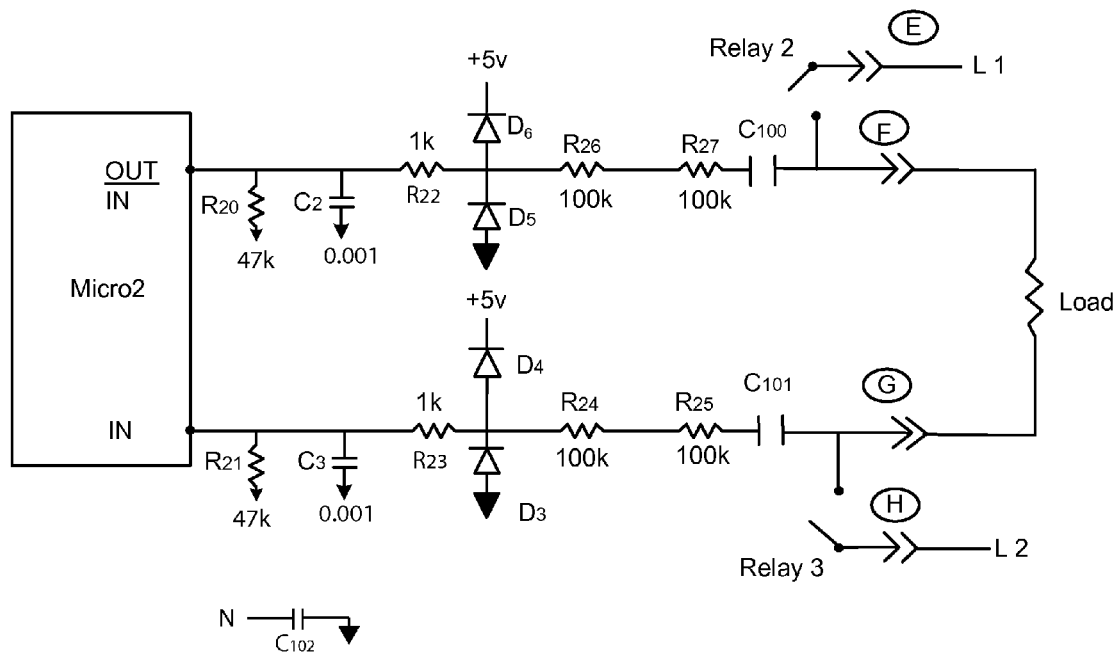

FIG. 11 is a schematic diagram of another embodiment of the diagnostic circuit. The circuit shown in FIG. 11 is constructed similarly to the circuit shown in FIG. 10 and is operated similarly to that circuit. However, the circuit shown in FIG. 11 has additionally been provided with isolation capacitors $C_{100}$ and $C_{101}$ that serve to isolate the circuitry shown to the left of the isolation capacitors $C_{100}$ and $C_{101}$ from the circuitry shown to the right of the isolation capacitors $C_{100}$ and $C_{101}$. Also, an isolation capacitor $C_{102}$ is connected between neutral N of the appliance under test and DC ground. For example, the diagnostic circuit could have a terminal with one end of the isolation capacitor $C_{102}$ connected thereto and the other end of the isolation capacitor $C_{102}$ connected to DC ground. That terminal would then be connected to the neutral N of the appliance under test to thereby connect one end of the isolation capacitor $C_{102}$ to neutral N of the appliance under test.

Once again, the load LOAD is sensed without closing either Relay 2 or Relay 3, and the voltage sensing and signal generation device MICRO2 is set to the operating mode in which the pulse train of the predetermined frequency is output at the input/output IN/OUT of the voltage sensing and signal generation device MICRO2. After the load LOAD is seen, the operating mode of the voltage sensing and signal generation device MICRO2 is set such that the input/output IN/OUT is turned back to an input. When either Relay 2 or Relay 3 is turned on, the AC waveform input from line L1 or line L2 will cause a 50/60 HZ on-off signal to appear at the input IN and at the input/output IN/OUT which has been turned back to an input. The chosen values of the components will depend on the frequency of the output pulse train and on the method of detecting the load LOAD. For example, when the predetermined frequency of the pulse train that is output at the input/output IN/OUT is chosen to be 10 kHZ, the values of the capacitors $C_{100}$, $C_{101}$, and $C_{102}$ could be, for example, $C_{100}=C_{101}=0.01$ μF and $C_{102}=0.1$ μF. However, higher or lower values could also be used. As another example, when the predetermined frequency of the pulse train that is output at the input/output IN/OUT is chosen to be 1 kHZ, the values of the capacitors $C_{100}$, $C_{101}$, and $C_{102}$ could be, for example, $C_{100}=C_{101}=0.01$ μF and $C_{102}=0.0047$ μF.

Figure 12:
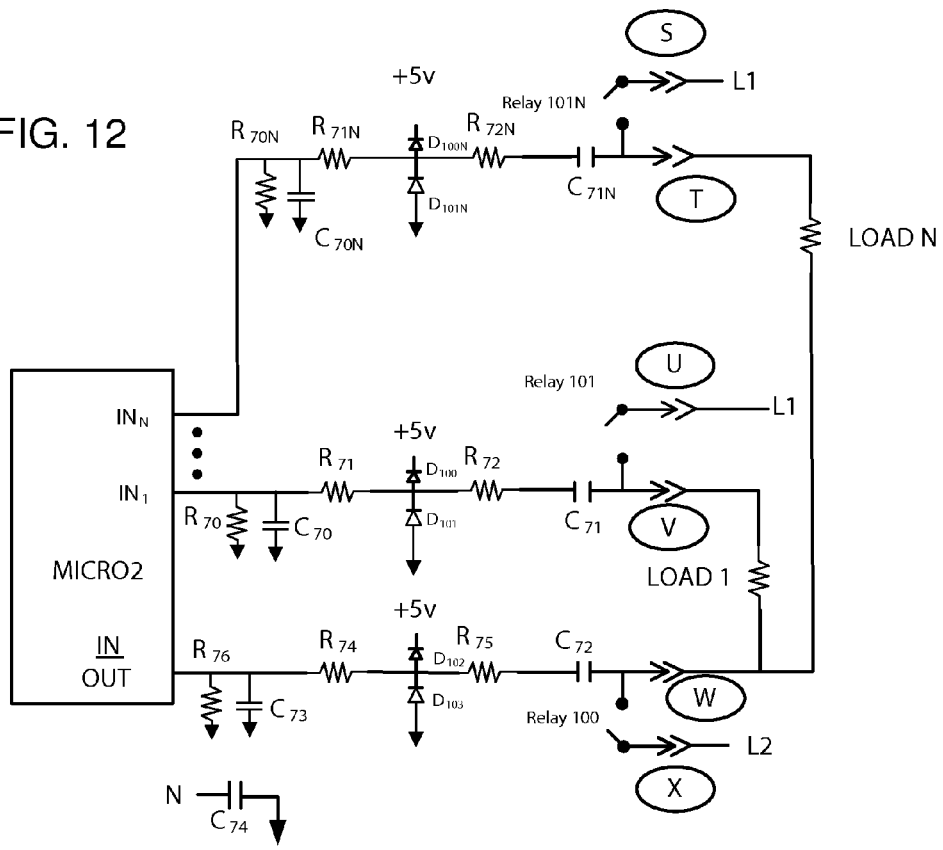

FIG. 12 is a schematic diagram of another embodiment of the diagnostic circuit in which more than one heater load LOAD 1, . . . , LOAD N can be sensed. The circuit shown in FIG. 12 is constructed and operated similarly to the circuit shown in FIG. 11. The differences in the circuit shown in FIG. 12 include providing the voltage sensing and signal generation device MICRO2 with multiple inputs $IN_1, \ldots, IN_N$ that apply their input signals to the micro-controlled A/D device of the voltage sensing and signal generation device MICRO2, and providing the circuit with multiple branches that each have a respective load (LOAD 1, . . . , or LOAD N) connected to one of the inputs $IN_1, \ldots, IN_N$ of the voltage sensing and signal generation device MICRO2. Only two loads LOAD 1 and LOAD N have been illustrated. However, it should be understood that any desired number of additional branches, which each have a load and which are each connected to a respective input of the voltage sensing and signal generation device MICRO2, could be provided. The three dots drawn vertically between input $IN_1$, and input $IN_N$ are used to represent the possible additional non-illustrated inputs of the voltage sensing and signal generation device MICRO2 which would each be connected to a respective non-illustrated branch with a non-illustrated load.

The diagnostic circuit has terminals or connection points W, V, and T for connecting to the loads LOAD 1, . . . , LOAD N (of course additional terminals or connection points can be provided in accordance with the actual number of loads). The diagnostic circuit also has terminals or connection points X, U, and S for connecting to the A/C lines L1 and L2 of the appliance under test (of course additional terminals or connection points can be provided in accordance with the actual number of loads).

An isolation capacitor $C_{74}$ could be connected between neutral N of the appliance under test and DC ground. For example, the diagnostic circuit could have a terminal with one end of the isolation capacitor $C_{74}$ connected thereto and the other end of the isolation capacitor $C_{74}$ connected to DC ground. That terminal would then be connected to the neutral N of the appliance under test to thereby connect one end of the isolation capacitor $C_{74}$ to neutral N of the appliance under test.

When the predetermined frequency of the pulse train that is output at the input/output IN/OUT is chosen to be 10 kHZ, exemplary values for the components $R_{70N}, C_{70N}, R_{71N}, R_{72N}$, and $C_{71N}$ in the branch connected to the input $IN_N$, exemplary values for the components $R_{70}, C_{70}, R_{71}, D_{100}, D_{101}, R_{72}$, and $C_{71}$ in the branch connected to the input $IN_1$, and exemplary values for the components $R_{76}, C_{73}, R_{74}, R_{75}$, and $C_{72}$ in the branch connected to the input/output IN/OUT are as follows: $R_{70N}=R_{70}=R_{76}=10K$ ohms, $C_{70N}=C_{70}=C_{73}=0.001$ μF, $R_{71N}=R_{70}=R_{74}=1K$ ohms, $R_{72N}=R_{72}=R_{75}=200K$ ohms, and isolation capacitors $C_{71N}=C_{71}=C_{72}=0.01$ μF. The diode pairs $D_{100N}/D_{101N}$, $D_{100}/D_{101}$ and $D_{103}/D_{102}$ are each connected between the positive DC supply potential +5 V and ground.

All of the relays, namely, Relay 100, Relay 101, . . . , Relay 101N are placed in the open state to sense whether the loads LOAD 1, . . . , LOAD N are connected. The voltage sensing and signal generation device MICRO2 is set to the operating mode in which a signal, preferably, a pulse train of a predetermined frequency is output at the input/output IN/OUT of the voltage sensing and signal generation device MICRO2. For each one of the loads LOAD 1, . . . , LOAD N to be detected, either the pulse train output by the input/output IN/OUT is sensed at the corresponding input $IN_1 \ldots IN_N$ or a change of the voltage across an appropriate capacitor $(C_{70}, \ldots, C_{70N})$ in the corresponding branch is sensed. For example, the signal that is input at the input $IN_1$ of the voltage sensing and signal generation device MICRO2 enables the micro-controlled A/D device MICRO of the voltage sensing and signal generation device MICRO2 to detect the load LOAD 1 by either sensing the pulse train output by the input/output IN/OUT or by sensing a change of the voltage across the capacitor $C_{70}$ of about 0.5 Vcc. Likewise, the signal that is input at the input $IN_N$ of the voltage sensing and signal generation device MICRO2 enables the micro-controlled A/D device MICRO of the voltage sensing and signal generation device MICRO2 to detect the load LOAD N by either sensing the pulse train output by the input/output IN/OUT or by sensing a change of the voltage across the capacitor $C_{70N}$ of about 0.5 Vcc. The sensing is performed in a similar way for each of the loads to be detected.

After all of the loads LOAD 1, . . . , LOAD N have been detected, the operating mode of the voltage sensing and signal generation device MICRO2 is changed such that the input/output IN/OUT is turned back to an input. Then the AC line voltage input at line L2 via Relay 100 and at each respective one of the connections to line L1 via one of the Relays 101, . . . , 101N are sensed in a manner similarly to the way that has been explained with reference to the circuit shown in FIG. 6 and Table IV.

Alternately, although not preferred, rather than sense all of the loads LOAD 1, . . . , LOAD N first in the mode of operation in which the input/output IN/OUT is an output, and then sense the line voltages from the lines L1 and L2 at all the inputs $IN_1, \ldots, IN_N$ and at the input/output IN/OUT, it is possible to switch back and forth between the operating modes. For example, the load LOAD 1 could be first sensed in the mode of operation in which the input/output IN/OUT is an output, and then the AC line voltages at the input $IN_1$ and at the input/output IN/OUT could be sensed in the mode of operation in which the input/output IN/OUT is an input. This sequence would subsequently be repeated for all loads, for example, until the load LOAD N is sensed in the mode of operation in which the input/output IN/OUT is an output, and then the AC line voltages at the input $IN_N$ and at the input/output IN/OUT are sensed in the mode of operation in which the input/output IN/OUT is an input.

Figure 13:
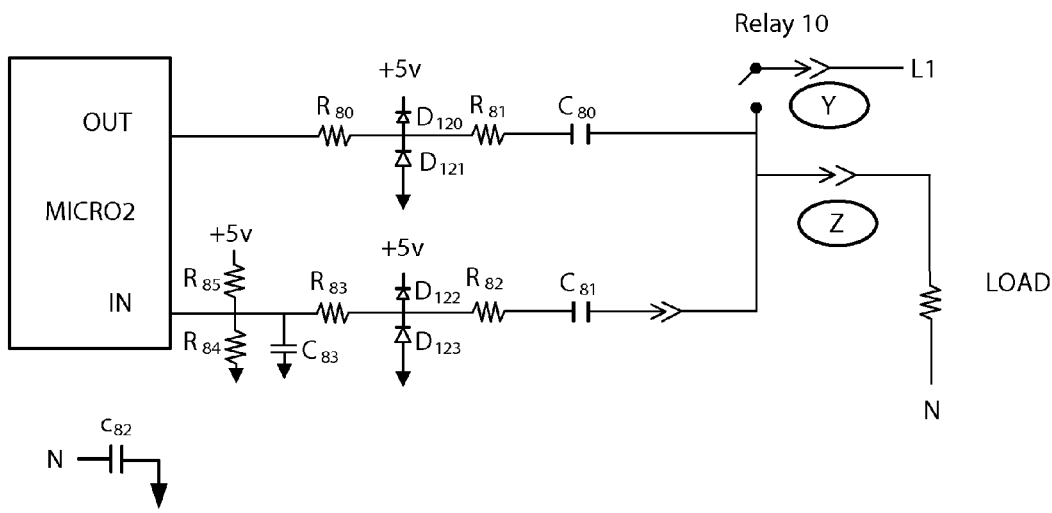

FIG. 13 is a schematic diagram of another embodiment of the diagnostic circuit in which only one side relay, namely, relay 10 is provided. This circuit is used with 110 V AC loads. Such loads typically have higher impedances compared to the loads used in the circuits shown in FIGS. 10-12. One example of higher impedance load to be used with the circuit shown in FIG. 13 is a light bulb having an impedance of 200 ohms. Of course other higher impedance loads can also be used, such as, for example, 2K ohms. The circuit includes resistors $R_{80}$-$R_{85}$, diodes $D_{121}$-$D_{122}$, and isolation capacitors $C_{80}$-$C_{81}$. The isolation capacitors $C_{80}$ and $C_{81}$ isolate the components of the diagnostic circuit located left of the isolation capacitors $C_{80}$ and $C_{81}$ from the Load LOAD and the AC Line L1.

Another isolation capacitor $C_{82}$ could be connected between neutral N of the appliance under test and DC ground. For example, the diagnostic circuit could have a terminal with one end of the isolation capacitor $C_{82}$ connected thereto and the other end of the isolation capacitor $C_{82}$ connected to DC ground. That terminal would then be connected to the neutral N of the appliance under test to thereby connect one end of the isolation capacitor $C_{82}$ to neutral N of the appliance under test.

The diagnostic circuit has a terminal or connection point Z for connecting to the load LOAD, and a connection point Y for connecting to the A/C line L1 of the appliance under test.

When the predetermined frequency of the pulse train that is output at the input/output IN/OUT is chosen to be 10 kHZ and when the load LOAD has an impedance of 2 K ohms, example component values could be as follows: $R_{80}=R_{81}=R_{82}=R_{83}=100$ ohms, $R_{84}=R_{85}=10$ k ohms, $C_{82}=0.001$ µF, $C_{83}=0.1$ µF, and isolation capacitors $C_{80}=C_{81}=0.0047$ µF. Of course, it should be understood that different values could be used.

The voltage sensing and signal generation device MICRO2 includes an output OUT to send out a signal that has a high frequency compared to frequency of the AC signal that is applied at Line L1. Preferably, the values of the components $R_{80}$, $R_{81}$, $C_{80}$, $C_{81}$, $R_{82}$, and $R_{83}$, are chosen such that with Relay 10 open and with an open load LOAD, just enough of the high frequency signal will pass to the input IN to enable the voltage sensing and signal generation device MICRO2 to sense the high frequency signal. When the load LOAD is present, it is in parallel with the return signal path and loads down the high frequency signal such that the high frequency signal is too small to be seen at the input. After the load is confirmed, the output is turned off and the Relay 10 is closed. The input IN of the voltage sensing and signal generation device MICRO2 is then used to look for a 50/60 HZ signal confirming that the AC voltage has been applied to the load LOAD via Relay 10.

Figure 14:
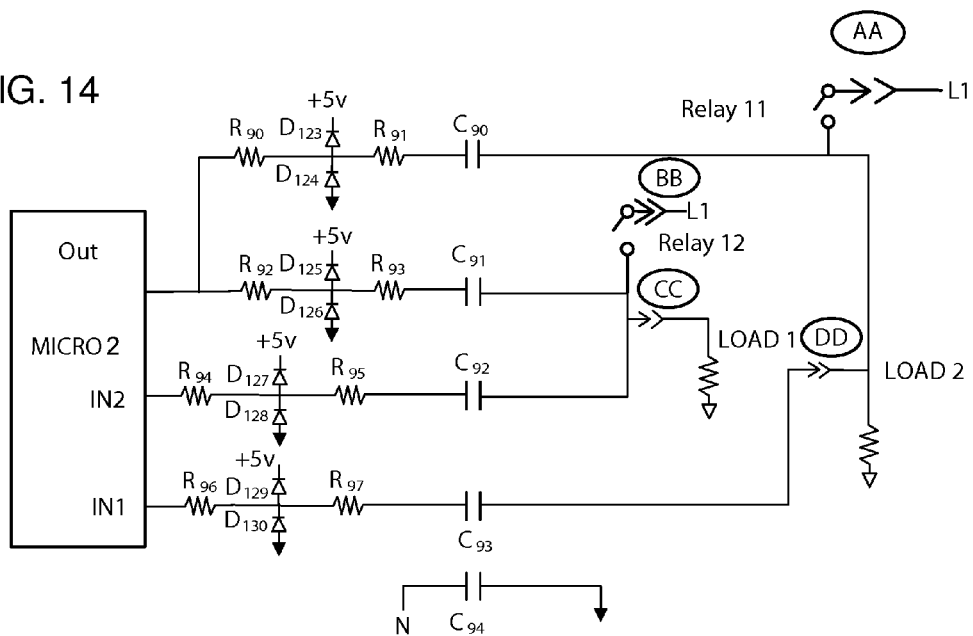

FIG. 14 is a schematic diagram of another embodiment of the diagnostic circuit in which the output Out is used to excite more than one load, such as, LOAD 1 and LOAD2 in parallel.

The diagnostic circuit has terminals or connection points CC and DD for connecting to the loads LOAD 1, and LOAD 2. The diagnostic circuit also has terminals or connection points AA and BB for connecting to the NC line L1 of the appliance under test.

The voltage sensing and signal generation device MICRO2 has an input IN2 for sensing the signal injected to the load LOAD 1 from the output Out. The voltage sensing and signal generation device MICRO2 also has an input IN1 for sensing the signal that is simultaneously injected to the load LOAD 2 from the output Out. The sensing is accomplished the same as described above, but all loads LOAD1, LOAD2 must be confirmed before any AC signal is applied at Line L1 via Relay 11 or Relay 12.

Exemplary component values are as follows: $R_{90}$-$R_{91}$-$R_{92}$-$R_{93}$-$R_{94}$-$R_{95}$-$R_{96}$-$R_{97}$=100 ohms, LOAD1=LOAD2=2K ohms, $C_{90}=C_{91}=C_{92}=C_{93}=0.0047$ µF, and $C_{94}=0.1$ µF. The diode pairs $D_{123}/D_{124}$, $D_{125}/D_{126}$, $D_{127}/D_{128}$, and $D_{129}/D_{130}$ are each connected between the positive DC supply potential +5 V and ground. Capacitors $C_{90}$-$C_{93}$ serve as isolation capacitors to isolate the components located to the left of the isolation capacitors $C_{90}$-$C_{93}$ from the loads LOAD 1 and LOAD 2 and from the A/C line L1.

Another isolation capacitor $C_{94}$ could be connected between neutral N of the appliance under test and DC ground. For example, the diagnostic circuit could have a terminal with one end of the isolation capacitor $C_{94}$ connected thereto and the other end of the isolation capacitor $C_{94}$ connected to DC ground. That terminal would then be connected to the neutral N of the appliance under test to thereby connect one end of the isolation capacitor $C_{94}$ to neutral N of the appliance under test.

Figure 15:
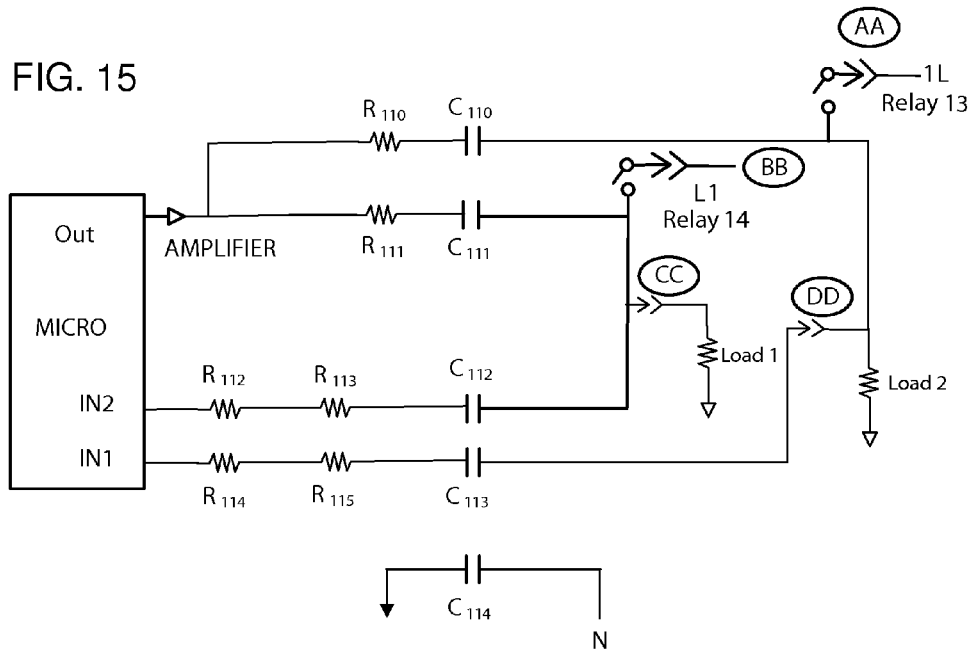

The output impedances must be able to drive the maximum loading and may require a buffer AMPLIFIER as shown in the embodiment of the diagnostic circuit in FIG. 15. Once again, the output Out is used to excite more than one load, such as, LOAD 1 and LOAD2 in parallel. The voltage sensing and signal generation device MICRO2 has an input IN2 for sensing the signal injected to the load LOAD 1 from the output Out. The micro-controlled A/D device MICRO also has an input IN1 for sensing the signal that is simultaneously injected to the load LOAD 2 from the output Out. The sensing is accomplished the same as described above, but all loads LOAD1, LOAD2 must be confirmed before any AC signal is applied at Line L1 via Relay 13 or Relay 14. Exemplary component values are as follows: $R_{110}$-$R_{112}$-$R_{113}$-$R_{114}$-$R_{115}$=100 ohms, LOAD1=LOAD2=2K ohms, $C_{110}=C_{111}=C_{112}=C_{113}=0.0047$ µF, and $C_{114}=0.1$ µF. Capacitors $C_{110}$-$C_{113}$ serve as isolation capacitors to isolate the components located to the left of the isolation capacitors $C_{110}$-$C_{113}$ from the loads LOAD 1 and LOAD 2 and from the A/C line L1.

Another isolation capacitor $C_{114}$ could be connected between neutral N of the appliance under test and DC ground. For example, the diagnostic circuit could have a terminal with one end of the isolation capacitor $C_{114}$ connected thereto and the other end of the isolation capacitor $C_{114}$ connected to DC ground. That terminal would then be connected to the neutral N of the appliance under test to thereby connect one end of the isolation capacitor $C_{114}$ to neutral N of the appliance under test.

We claim:

1. A diagnostic circuit for connecting to a unit under test having a load and two lines of a sinusoidal source, the diagnostic circuit comprising:
   a voltage sensing and signal generation device having an input/output and an input;
   a plurality of terminals including first terminals for connecting to the load and second terminals for connecting to the two lines of the sinusoidal source, one of said first terminals connected to said input/output, and another one of said first terminals connected to said input;
   a plurality of relays, one of said plurality of relays connected between one of said second terminals and said input/output, and another one of said plurality of relays connected between another one of said second terminals and said input;
a D/C voltage source and ground;
a first diode pair having a first clamping diode connected between said D/C voltage source and said input/output and a second clamping diode connected between said ground and said input/output; and
a second diode pair having a first clamping diode connected between said D/C voltage source and said input and a second clamping diode connected between said ground and said input.

2. The diagnostic circuit according to claim 1, further comprising:
a first capacitor connected between said input/output and said ground; and
a second capacitor connected between said input and said ground.

3. The diagnostic circuit according to claim 1, further comprising:
at least one first resistor connected between said input/output and a first one of said first terminals for limiting a current sensed at said input/output; and
at least one second resistor connected between said input and a second one of said first terminals for limiting a current sensed at said input.

4. The diagnostic circuit according to claim 1, further comprising:
a first pull-down resistor connected between said input/output and said ground; and
a second pull-down resistor connected between said input and said ground.

5. The diagnostic circuit according to claim 1, further comprising:
a first isolation capacitor connected between said input/output and a first one of said first terminals;
a second isolation capacitor connected between said input and a second one of said first terminals; and
a third isolation capacitor for connection between neutral and DC ground.

6. The diagnostic circuit according to claim 1, wherein: said voltage sensing and signal generation device has a first operating mode in which said input/output of said voltage sensing and signal generation device is an output, and a second operating mode in which said input/output of said voltage sensing and signal generation device is an input.

7. The diagnostic circuit according to claim 1, further comprising:
an additional terminal for connecting to an additional load, said voltage sensing and signal generation device having a further input connected to said additional terminal;
a further terminal for connecting to one of the two lines of the sinusoidal source;
a further relay connected between said further terminal and said further input; and
a third diode pair having a first clamping diode connected between said D/C voltage source and said further input and a second clamping diode connected between said ground and said further input.

8. The diagnostic circuit according to claim 7, further comprising:
a pull-down resistor connected between said further input and said ground;
a capacitor connected between said further input and said ground;
at least one resistor connected between said further input and said additional terminal; and an isolation capacitor connected between said further input and said additional terminal.

9. A diagnostic circuit for connecting to a unit under test having a load and a sinusoidal source, the diagnostic circuit comprising:
a voltage sensing and signal generation device having an input for sensing a signal and an output for providing a signal;
a first terminal for connecting to the load and a second terminal for connecting to the sinusoidal source;
a relay connected between said second terminal and said input;
a D/C voltage source and ground;
a first diode pair having a first clamping diode connected between said D/C voltage source and said input and a second clamping diode connected between said ground and said input; and
a second diode pair having a first clamping diode connected between said D/C voltage source and said output and a second clamping diode connected between said ground and said output.

10. The diagnostic circuit according to claim 9, further comprising:
a pull-down resistor connected between said input and said ground;
a capacitor connected between said input and said ground;
at least one resistor connected between said input and said first terminal;
an isolation capacitor connected between said input and said first terminal;
an isolation capacitor connected between said output and said first terminal; and
an isolation capacitor for connection between neutral and DC ground.

11. A diagnostic circuit for connecting to a unit under test having a load and a sinusoidal source, the diagnostic circuit comprising:
a voltage sensing and signal generation device having a first input, a second input, and an output;
a plurality of first terminals, each one of said plurality of first terminals for connecting to a respective one of a plurality of loads;
a plurality of second terminals for connecting to the sinusoidal source;
a plurality of relays each connected between a respective one of said plurality of second terminals and a respective one of said plurality of first terminals;
a D/C voltage source and ground;
a first diode pair having a first clamping diode connected between said D/C voltage source and said first input and a second clamping diode connected between said ground and said first input;
a second diode pair having a first clamping diode connected between said D/C voltage source and said second input and a second clamping diode connected between said ground and said second input; and
a third diode pair having a first clamping diode connected between said D/C voltage source and said output and a second clamping diode connected between said ground and said output.

12. The diagnostic circuit according to claim 11, further comprising:
a first resistor connected between said output and said third diode pair;
a second resistor connected to said output; and
a fourth diode pair having a first clamping diode connected between said D/C voltage source and said second resistor and a second clamping diode connected between said ground and said second resistor.

13. The diagnostic circuit according to claim 11, further comprising:
- at least one resistor and an isolation capacitor connected in series between said first input and a first one of said plurality of first terminals;
- at least one resistor and an isolation capacitor connected in series between said second input and a second one of said plurality of first terminals;
- at least one resistor and an isolation capacitor connected in series between said output and said first one of said plurality of first terminals;
- at least one resistor and an isolation capacitor connected in series between said output and said first one of said plurality of first terminals; and
- an isolation capacitor for connection between neutral and DC ground.

14. The diagnostic circuit according to claim 11, further comprising:
- at least one resistor and an isolation capacitor connected in series between said first input and a first one of said plurality of first terminals;
- at least one resistor and an isolation capacitor connected in series between said second input and a second one of said plurality of first terminals;
- an amplifier having an input connected to said output, said amplifier having an output;
- at least one resistor and an isolation capacitor connected in series between said output of said amplifier and said first one of said plurality of first terminals;
- at least one resistor and an isolation capacitor connected in series between said output of said amplifier and said first one of said plurality of first terminals; and
- an isolation capacitor for connection between neutral and DC ground.

* * * * *